（12）United States Patent
Utsunomiya

(10) Patent No.: US 9,530,810 B2
(45) Date of Patent: Dec. 27, 2016

(54) PHOTOELECTRIC CONVERSION DEVICE

(71) Applicant: Seiko Instruments Inc., Chiba-shi, Chiba (JP)

(72) Inventor: Fumiyasu Utsunomiya, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 14/976,718

(22) Filed: Dec. 21, 2015

(65) Prior Publication Data
US 2016/0190189 A1  Jun. 30, 2016

(30) Foreign Application Priority Data

Dec. 25, 2014 (JP) .................................. 2014-262943

(51) Int. Cl.
H01L 27/15    (2006.01)
H01L 31/12    (2006.01)
H01L 33/00    (2010.01)
H01L 27/146   (2006.01)

(52) U.S. Cl.
CPC .............................. *H01L 27/14612* (2013.01)

(58) Field of Classification Search
CPC .............. H01L 27/0814; H01L 27/1104; H01L 27/11898; H01L 29/6603; H01L 29/781; H01L 29/7827; H01L 29/0852; H01L 29/7816; H01L 51/5296
USPC ......... 257/79, 104, 113, 233, 235, 288, 290, 257/292, 334, 499, 565, E21.053, 257/E21.177, E21.352, E21.366, E21.368, 257/E21.371, E21.372, E21.373, E21.374, 257/E21.387, E21.389
See application file for complete search history.

(56) References Cited

U.S. PATENT DOCUMENTS

| | | | | |
|---|---|---|---|---|
| 5,252,820 A | * | 10/1993 | Shinomiya | .............. H03F 3/087 250/214 R |
| 5,389,778 A | * | 2/1995 | Shinomiya | .............. H03F 3/087 250/214 R |
| 7,733,401 B2 | * | 6/2010 | Takeda | ................. H04N 5/2353 348/308 |
| 8,779,377 B2 | * | 7/2014 | Yamada | ................... H04N 5/32 250/394 |

FOREIGN PATENT DOCUMENTS

JP    2001-308306 A    11/2001

* cited by examiner

*Primary Examiner* — David Nhu
(74) *Attorney, Agent, or Firm* — Brinks Gilson & Lione

(57) ABSTRACT

To provide a photoelectric conversion device which prevents a reset time from being made long when a large quantity of light is entered. There is provided a photoelectric conversion device equipped with a photodiode which causes a photoelectric current corresponding to a quantity of incident light to flow, a reset circuit which charges a parasitic capacitance of the photodiode to a reset voltage, a voltage limit circuit which prevents the voltage of the parasitic capacitance of the photodiode from being lower than a prescribed voltage, and an output circuit which outputs the voltage of the parasitic capacitance of the photodiode.

2 Claims, 3 Drawing Sheets

US 9,530,810 B2

PHOTOELECTRIC CONVERSION DEVICE

RELATED APPLICATIONS

This application claims priority under 35 U.S.C. §119 to Japanese Patent Application No. 2014-262943 filed on Dec. 25, 2014, the entire content of which is hereby incorporated by reference.

BACKGROUND OF THE INVENTION

Field of the Invention

The present invention relates to a photoelectric conversion device which outputs an output signal corresponding to a photoelectric current generated in a photoelectric conversion element.

Background Art

FIG. 4 illustrates a circuit diagram of the periphery of a photoelectric conversion element of a related art photoelectric conversion device. A circuit for the periphery of the photoelectric conversion element of the related art photoelectric conversion device is comprised of a reset circuit 103, a photodiode 105 which is the photoelectric conversion element, an NMOS transistor 415, an NMOS transistor 401, and a signal output line 403. The photodiode 105 generates a photoelectric current corresponding to the quantity of light incident thereon. The reset circuit 103 resets the voltage of the photodiode 105 to a reset voltage. The NMOS transistor 415 outputs a voltage based on the voltage of the photodiode 105 from a source thereof. The NMOS transistor 401 selects whether to output the source voltage of the NMOS transistor 415 to the signal output line 403. The reset circuit 103 is comprised of an NMOS transistor 113 having a gate connected to a reset signal input terminal 112, a drain connected to a reset voltage input terminal 120, and a source connected to an N type terminal of the photodiode 105.

The NMOS transistor 415 has a gate connected to the N type terminal of the photodiode 105, a drain connected to a power supply terminal 100, and a source connected to a drain of the NMOS transistor 401. The NMOS transistor 401 has a gate connected to an output selection signal input terminal 402 and a source connected to the signal output line 403. The photodiode 105 has a P type terminal connected to a GND terminal 101.

The related art photoelectric conversion device configured as above is operated in the following manner and outputs an output signal corresponding to the generated photoelectric current.

When a reset signal is inputted to the reset signal input terminal 112, the voltage of an N type electrode of the photodiode 105 is reset to a reset voltage Vres inputted to the reset voltage input terminal 120. Therefore, the photodiode 105 has its own parasitic capacitance charged with the reset voltage Vres. When the above reset is released, the photodiode 105 discharges the voltage of the parasitic capacitance with the photoelectric current corresponding to the incident light. After a prescribed time has elapsed, the photodiode 105 is reset again. The discharge voltage after the discharge of the photodiode 105, and the reset voltage of the re-reset photodiode 105 are respectively converted into the source voltage of the NMOS transistor 415, which is outputted to the signal output line 403 via the NMOS transistor 401 every time. The voltages based on the reset voltage and the discharge voltage of the photodiode 105 both outputted to the signal output line 403 are compared with each other by an unillustrated output circuit. The output circuit amplifies a voltage difference obtained by comparison of the voltages by means of an amplifier circuit and outputs the amplified voltage as a voltage proportional to the incident light quantity of the photodiode 105 (for example, refer to Patent Document 1).

[Patent Document 1] Japanese Patent Application Laid-Open No. 2001-308306

SUMMARY OF THE INVENTION

The related art photoelectric conversion device is however accompanied by a problem that when the voltage of the photodiode is reset after strong light is entered into the photodiode which is the photoelectric conversion element, the time is required until the voltage of the photodiode reaches the reset voltage.

The photoelectric conversion device is used in an image reading apparatus. There is a strong need for an increase in reading speed in a recent image reading apparatus. For this reason, the photoelectric conversion device needs to repeatedly read an image at high speed. In order to repeatedly read the image at high speed, the reset time of the photodiode where such image reading is repeatedly done at this time is also required to be shortened for the related art photoelectric conversion device. Since, however, strong light is entered into the photodiode depending on a method for reading an image, the reset time of the photodiode is required to be set long. The image reading apparatus using the above-described related art photoelectric conversion device is therefore accompanied by a problem that it is not possible to make reading faster.

To solve the related art problems described above, a photoelectric conversion device of the present invention is configured as follows:

There is provided a photoelectric conversion device equipped with a photodiode which causes a photoelectric current corresponding to an incident light quantity to flow, a reset circuit which charges a parasitic capacitance of the photodiode to a reset voltage, a voltage limit circuit which prevents the voltage of the parasitic capacitance of the photodiode from being lower than a prescribed voltage, and an output circuit which outputs the voltage of the parasitic capacitance of the photodiode.

According to the photoelectric conversion device of the present invention, when a photodiode incorporated as a photoelectric conversion element is reset after an unexpected strong light quantity is entered into the photodiode, a photodiode voltage at the start of the reset is limited to a prescribed voltage or more. It is therefore possible to prevent an increase in the parasitic capacitance of the photodiode due to a voltage drop in the photodiode and shorten the time taken to charge the parasitic capacitance to a reset voltage.

DETAILED DESCRIPTION OF THE PREFERRED EMBODIMENTS

Figure 1:
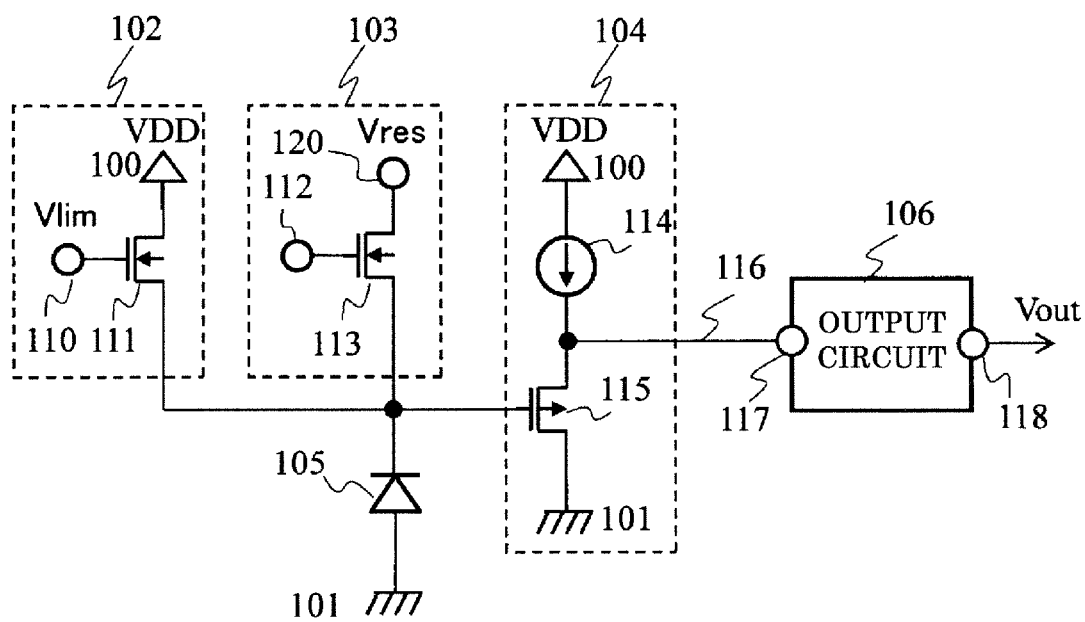
FIG. 1 is a circuit diagram illustrating a photoelectric conversion element peripheral circuit of a photoelectric conversion device according to the present embodiment.

FIG. 1 is a circuit diagram illustrating a photoelectric conversion element peripheral circuit of a photoelectric conversion device according to the present embodiment. The photoelectric conversion device according to the present embodiment has a limit circuit 102, a reset circuit 103, a photodiode 105, a source follower circuit 104, and an output circuit 106.

The photodiode 105 has a photoelectric converting function and generates a photoelectric current corresponding to the quantity of incident light. The limit circuit 102 limits the voltage of the photodiode 105 so as not to be a set limit voltage or less. The reset circuit 103 resets the voltage of the photodiode 105 to a reset voltage Vres. The source follower circuit 104 outputs a voltage based on the voltage of the photodiode 105. The output circuit 106 processes the voltage outputted from the source follower circuit 104 and outputs an output voltage Vout based on the result of processing thereof.

The limit circuit 102 is comprised of an NMOS transistor 111 having a gate connected to a limit voltage input terminal 110, a drain connected to a power supply terminal 100, and a source connected to an N type terminal of the photodiode 105. The reset circuit 103 is comprised of an NMOS transistor 113 having a gate connected to a reset signal input terminal 112, a drain connected to a reset voltage input terminal 120, and a source connected to the N type terminal of the photodiode 105. The source follower circuit 104 is comprised of a constant current source 114 and a PMOS transistor 115. The constant current source 114 is provided between the power supply terminal 100 and a source of the PMOS transistor 115 and supplies a constant current from the power supply terminal 100 to the source of the PMOS transistor 115. The PMOS transistor 115 has a gate connected to the N type terminal of the photodiode 105, a drain connected to a GND terminal 101, and a source connected to an input terminal 117 of the output circuit 106. The photodiode 105 has a P type terminal connected to the GND terminal 101.

The photoelectric conversion device according to the present embodiment is operated in the following manner and outputs an output signal corresponding to a generated photoelectric current.

When a reset signal is inputted to the reset signal input terminal 112, the photodiode 105 is reset from the voltage of its N-type electrode to the reset voltage Vres. Therefore, the photodiode 105 has its own parasitic capacitance charged with the reset voltage. Thereafter, the photodiode 105 discharges the reset voltage charged to its own parasitic capacitance with a photoelectric current generated with photoelectric conversion by itself. Then, the photodiode 105 is reset again to the reset voltage again. The limit circuit 102 starts to function when the voltage of the photodiode 105 falls below a value obtained by subtracting a threshold voltage of the NMOS transistor 111 from a limit voltage Vlim inputted to the limit voltage input terminal 110. The limit circuit having started to function prevents a further voltage drop at the N type terminal of the photodiode 105. On the other hand, the reset voltage of the photodiode 105 reset again, and a discharge voltage after the discharge of the photodiode 105 are respectively converted into a source voltage of the PMOS transistor 115 of the source follower circuit 104, followed by being inputted to the input terminal 117 of the output circuit 106. The output circuit 106 compares the voltages based on the reset and discharge voltages of the photodiode 105 outputted from the source follower circuit 104 to extract a voltage difference between these voltages. The extracted voltage difference is further amplified in a prescribed magnification by the output circuit 106 and outputted as an output voltage Vout from an output terminal 118 of the output circuit 106. The photoelectric conversion device according to the present embodiment assumes where it is used at a power supply voltage of 3.3V. In this case, the photoelectric conversion device is designed in such a manner that the reset voltage Vres is set to 2.2V and reduced by 0.5V or so from the reset voltage where the maximum quantity of light necessary for detection is made incident. This is because when the discharge voltage is more increased than 0.5V, the parasitic capacitance of a junction portion of the photodiode is suddenly increased so that a change in the output voltage with respect to a change in the quantity of incident light is not brought into linear form. Thus, in the photoelectric conversion device according to the present embodiment, when the quantity of light in an assumed range is read, the parasitic capacitance of the photodiode is not increased because the voltage of the photodiode is reduced only by 0.5V or so even at maximum from the reset voltage. On the other hand, when the quantity of strong light beyond the assumed range is made incident on the photoelectric conversion device according to the present embodiment, the discharge voltage of the photodiode is reduced to less than the assumed voltage and intended to be further reduced. Since, however, the limit circuit starts to function, the discharge voltage of the photodiode is limited to the limit voltage or more set by the limit circuit. Therefore, even when the quantity of strong light beyond the assumed range is entered into the photoelectric conversion device according to the present embodiment, the discharge voltage of the photodiode is limited to the limit voltage or more set by the limit circuit. Thus, the photoelectric conversion device according to the present embodiment is capable of preventing a reset time necessary upon charging the parasitic capacitance to the reset voltage Vres from becoming long, without increasing the parasitic capacitance of the photodiode.

As described above, the photoelectric conversion device according to the present embodiment needs not to set the reset time long even when the unexpected quantity of strong light is entered. It is thus possible to increase a reading speed of an image reading apparatus using the photoelectric conversion device according to the present embodiment.

Figure 2:
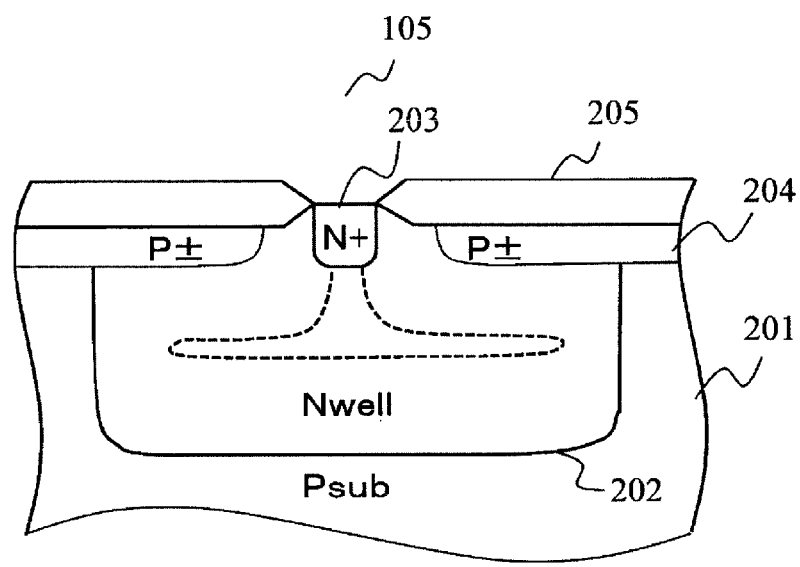
FIG. 2 is a diagram illustrating part of a sectional structure of a photodiode used in the photoelectric conversion device according to the present embodiment.

FIG. 2 is a diagram illustrating a sectional structure of part of the photodiode 105 used in the photoelectric conversion device according to the present embodiment.

The photodiode 105 has a P substrate region 201, an N well region 202, an N type region 203, a P type region 204, and a LOCOS oxide film 204. The LOCOS oxide film 204 is formed over the upper surface of a substrate in a state free of only a central square region. The N type region 203 shallow in depth is formed over the upper surface of the substrate, which is free of the LOCOS oxide film 203. The N well region 202 deep in depth is formed so as to surround the periphery of the N type region 203. A P type region shallow in depth is formed below the LOCOS oxide film 204. A GND terminal is connected to the P substrate region 201 and the P type region 204. The N type region 203 is inputted with a photodiode voltage.

A dotted line in FIG. 2 indicates a depletion layer region which extends from a junction to the N well region 202. When the photodiode voltage of the photodiode 105 is low, a depletion layer which extends from the junctions of the bottom surfaces of the P substrate region 201 and the N well region 202 to the N well region 202, and a depletion layer which extends from the junctions of the upper surfaces of the P type region 204 and the N well region 202 to the N well region 202 are separated from each other. Therefore, since the parasitic capacitance caused by the junction of the photodiode 105 exists in a wide region extending over the bottom and upper surfaces of the N well region 202, it becomes very large. Since, however, the depletion layers extending from the bottom and upper surfaces of the N well region 202 are coupled to each other when the photodiode voltage of the photodiode 105 is high, the parasitic capacitance caused by the junction capacitances at the bottom and upper surfaces of the N well region 202, which has been made large, becomes very small.

Figure 3:
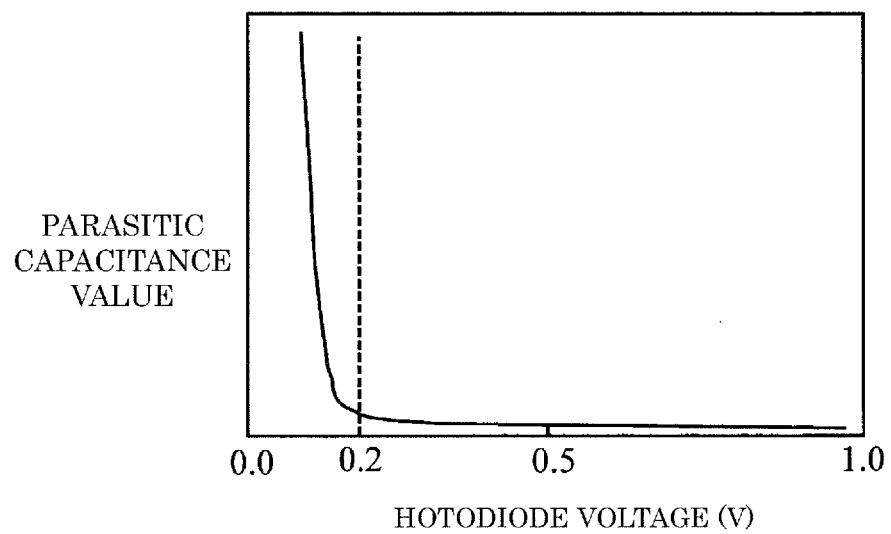
FIG. 3 is a graph illustrating the relation of a parasitic capacitance value of the photodiode to a voltage applied to the photodiode used in the photoelectric conversion device according to the present embodiment.
Figure 4:
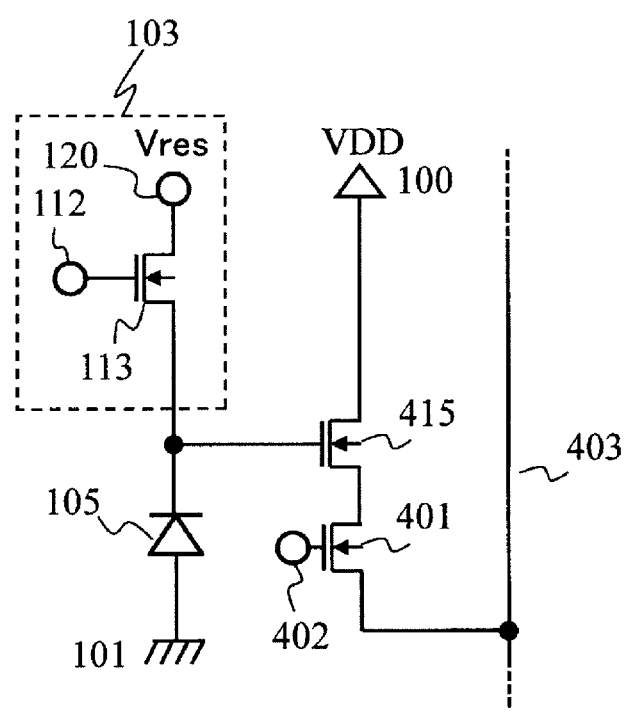
FIG. 4 is a circuit diagram illustrating a photoelectric conversion element peripheral circuit of a related art photoelectric conversion device.

FIG. 3 illustrates the relation of a parasitic capacitance value based on junction capacitances to the photodiode voltage of the photodiode having the above structure. The parasitic capacitance suddenly increases from around when the reducing photodiode voltage falls below 0.2V. The depletion layers extending from the bottom and upper surfaces of the N well region are completely separated from each other from around when the photodiode voltage falls below 0.1V. Therefore, the parasitic capacitance will increase suddenly.

In the photodiode used in the photoelectric conversion device according to the present embodiment, as described above, since the parasitic capacitance by the junction is small when the photodiode voltage is high, the speed of discharging of the parasitic capacitance of the photodiode itself by the photoelectric current of the photodiode becomes high. Therefore, the photoelectric conversion device according to the present embodiment is enhanced in sensitivity.

In the photoelectric conversion device according to the present embodiment, however, since the parasitic capacitance by the junction of the photodiode suddenly increases when the photodiode voltage falls below 0.2V, not only the speed of discharging of the parasitic capacitance of the photodiode itself by the photoelectric current of the photodiode becomes low, but also the time is taken for resetting from such a voltage. Therefore, when the photodiode voltage falls below 0.2V, the photoelectric conversion device according to the present embodiment is not only degraded in sensitivity but also needs to take the reset time long.

In order to solve the above problems, the photoelectric conversion device according to the present embodiment limits the drop in the photodiode voltage to 0.2V or more by means of the limit circuit. Consequently, the photoelectric conversion device according to the present embodiment is free from not only degradation of sensitivity but also a delay in reset time. Thus, even when the photoelectric conversion device according to the present embodiment is used in an image reading apparatus such as a bill reader which detects the incidence of weak light after the unexpected strong light has been entered, no erroneous detection is done.

Incidentally, the photoelectric conversion device according to the present embodiment has been shown by the configuration in which the limit NMOS transistor is provided separately from the reset NMOS transistor. However, even if the photoelectric conversion device is taken as a configuration that the reset and limit NMOS transistors are configured by a single NMOS transistor and that the reset voltage Vres is inputted to the gate of the NMOS transistor upon resetting and the limit voltage is inputted thereto upon limiting, the same effect as that of the photoelectric conversion device according to the present embodiment can be obtained. Further, the parasitic capacitance of the NMOS transistor, which is connected in parallel with the parasitic capacitance of the photodiode is decreased by making common the reset NMOS transistor and the limit NMOS transistor. Therefore, the photoelectric conversion device in which the reset NMOS transistor and the limit NMOS transistor are made common is improved in sensitivity rather than where they are not made common.

What is claimed is:

1. A photoelectric conversion device comprising:
   a photodiode configured to generate a photoelectric current corresponding to a quantity of incident light;
   a reset circuit connected to the photodiode and configured to charge a parasitic capacitance of the photodiode to a reset voltage;
   a voltage limit circuit connected to the photodiode, the voltage limit circuit including an NMOS transistor having a gate applied with a limit voltage and configured to prevent the voltage of the parasitic capacitance from falling below a prescribed voltage; and
   an output circuit connected to the photodiode and configured to output voltage of the parasitic capacitance.

2. The photoelectric conversion device according to claim 1,
   wherein when the voltage of the parasitic capacitance is lower than the prescribed voltage, the NMOS transistor is configured to generate a current corresponding to the photoelectric current to flow.

* * * * *